(12) United States Patent
Nishi (10) Patent No.: US 8,785,999 B2
(45) Date of Patent: Jul. 22, 2014

(54) SEMICONDUCTOR DEVICE

(75) Inventor: Hiroo Nishi, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/208,693

(22) Filed: Aug. 12, 2011

(65) Prior Publication Data

US 2011/0291239 A1    Dec. 1, 2011

Related U.S. Application Data

(62) Division of application No. 12/167,264, filed on Jul. 3, 2008, now Pat. No. 8,008,159.

(30) Foreign Application Priority Data

Jul. 5, 2007    (JP) .................................. 2007-177188

(51) Int. Cl.
*H01L 27/108*    (2006.01)
*H01L 29/94*    (2006.01)

(52) U.S. Cl.
USPC ............................. 257/304; 257/758; 257/775

(58) Field of Classification Search
CPC ................... H01L 27/10808; H01L 27/10882; H01L 27/10888; H01L 21/76897
USPC ................. 257/741, 750, 758, 773, 774, 776, 257/E23.142, E23.145, E23.151, E23.152, 257/307
See application file for complete search history.

(56) References Cited

U.S. PATENT DOCUMENTS

| | | | |
|---|---|---|---|
| 6,130,449 A * | 10/2000 | Matsuoka et al. ............ 257/296 |
| 6,395,632 B1 | 5/2002 | Farrar | |
| 6,461,911 B2 * | 10/2002 | Ahn et al. ...................... 438/253 |
| 6,479,343 B1 | 11/2002 | Hwang | |
| 6,589,711 B1 | 7/2003 | Subramanian et al. | |
| 6,670,663 B2 | 12/2003 | Hwang | |
| 6,768,154 B2 | 7/2004 | Miyajima | |
| 6,867,096 B2 * | 3/2005 | Cho et al. ...................... 438/256 |
| 6,869,872 B2 | 3/2005 | Suh | |
| 7,026,208 B2 | 4/2006 | Park | |
| 7,439,126 B2 | 10/2008 | Kuroki | |
| 2001/0018273 A1 * | 8/2001 | Park et al. ...................... 438/762 |
| 2001/0023990 A1 | 9/2001 | Yokoyama et al. | |
| 2003/0178728 A1 * | 9/2003 | Park et al. ...................... 257/758 |
| 2004/0051130 A1 * | 3/2004 | Miyajima ...................... 257/301 |
| 2005/0032304 A1 * | 2/2005 | Park et al. ...................... 438/253 |

FOREIGN PATENT DOCUMENTS

| | | |
|---|---|---|
| JP | 10-294441 | 11/1998 |
| JP | H11177052 A | 7/1999 |
| JP | 2000299448 A | 10/2000 |
| JP | 2002-083881 | 3/2002 |
| JP | 20035288442 A | 9/2003 |

(Continued)

*Primary Examiner* — Jae Lee
*Assistant Examiner* — Quovaunda V Jefferson
(74) *Attorney, Agent, or Firm* — Young & Thompson (57) ABSTRACT

A semiconductor device includes: a first interlayer insulating film; a first conductive member provided lower than the first interlayer insulating film; a contact plug that penetrates through the first interlayer insulating film, and is electrically connected to the first conductive member, the contact plug including a small-diameter part, and a large-diameter part arranged on the small-diameter part, an outer diameter of the large-diameter part being larger than an outer diameter of the small-diameter part, and the outer diameter of the large-diameter part being larger than an outer diameter of a connection face between the second conductive member and the large-diameter part; and a second conductive member that is provided on the first interlayer insulating film, and is electrically connected to the contact plug.

13 Claims, 6 Drawing Sheets (56) References Cited

FOREIGN PATENT DOCUMENTS

| | | |
|---|---|---|
| JP | 2003-282734 | 10/2003 |
| JP | 2003297952 A | 10/2003 |
| JP | 2004111624 A | 4/2004 |
| JP | 2004-207681 | 7/2004 |
| JP | 2004282041 A | 10/2004 |
| JP | 2005-167188 | 6/2005 |
| JP | 2007173470 A | 7/2007 |

* cited by examiner

SEMICONDUCTOR DEVICE

CROSS REFERENCE TO RELATED APPLICATIONS

This application is a division of application Ser. No. 12/167,264 filed on Jul. 3, 2008, which claims foreign priority to Japanese patent application No. 2007-177188. The content of each of these applications is hereby expressly incorporated by reference

BACKGROUND OF THE INVENTION

1. Field of the Invention

The present invention relates to a semiconductor device and a semiconductor device manufacturing method. The invention particularly relates to a semiconductor device and a semiconductor device manufacturing method that are suitable for application in a semiconductor device including a dynamic random access memory (DRAM) capacitor.

Priority is claimed on Japanese Patent Application No. 2007-177188, filed Jul. 5, 2007, the content of which is incorporated herein by reference.

2. Description of Related Art

Memory cells such as a DRAM include switching transistors and capacitors. With the advancement of minute work techniques, memory cells are becoming increasingly miniaturized. This has led to a problematic decrease in the amount of charge accumulated in the capacitor. To solve this problem, the height of the capacitor is increased by utilizing a capacitor over bit-line (COB) structure and forming a cup-shaped capacitor over the bit-line so that the area of the capacitor electrode is increased.

Figure 8:
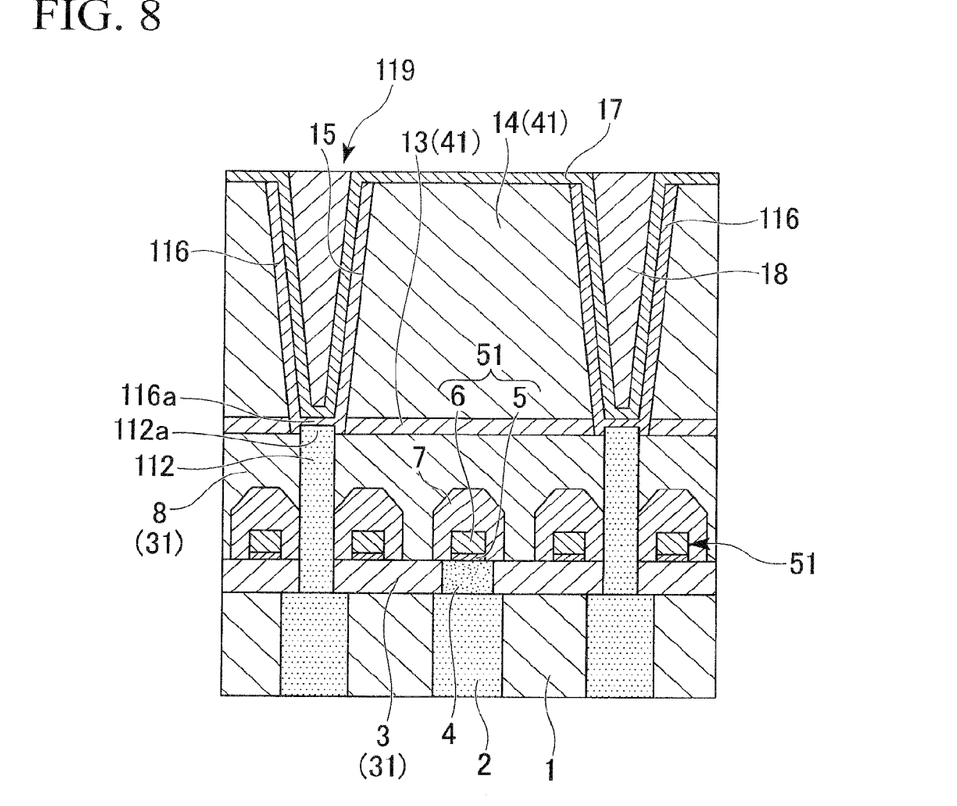
FIG. 8 is an explanatory view of part of a cross-sectional structure of a semiconductor device of related art, and is a cross-sectional view in a direction parallel to a gate wiring.

FIG. 8 is an explanatory diagram of part of a cross-sectional structure of a semiconductor device of related art. FIG. 8 is a cross-sectional view in a direction parallel to a gate wiring. A gate interlayer insulating film 1 shown in FIG. 8 is made of such as silicon oxide film. A cell contact plug 2 shown in FIG. 8 is made of such as polysilicon. A switching transistor (not shown) is provided below the gate interlayer insulating film 1. The cell contact plug 2 is electrically connected to an impurity dispersion layer of the transistor.

A first interlayer insulating film 31 is formed over the gate interlayer insulating film 1 and the cell contact plug 2. The first interlayer insulating film 31 includes a plug interlayer insulating film 3, and a bit-line interlayer insulating film 8 which is provided on the plug interlayer insulating film 3. The plug interlayer insulating film 3 is made of silicon oxide. The bit-line interlayer insulating film 8 is made of silicon oxide. A plurality of bit-lines 51 are provided on the plug interlayer insulating film 3. Each bit-line 51 includes a tungsten nitride film 5 and a metal film 6 such as tungsten film. The tungsten nitride film 5 and the metal film 6 are each covered by a bit-line insulating film 7 of silicon nitride film. The bit-line 51 that overlaps with the cell contact plug 2 is electrically connected to the cell contact plug 2 by a bit contact plug 4. The bit contact plug 4 is composed of such as metal that penetrates the plug interlayer insulating film 3.

A capacitor contact plug 112 shown in FIG. 8 is made of such as polysilicon. The capacitor contact plug 112 penetrates through a first interlayer insulating film 31. The capacitor contact plug 112 is electrically connected to an impurity dispersion layer of a transistor (not shown) arranged lower than the interlayer insulating film 1, via the cell contact plug 2.

A second interlayer insulating film 41 is provided on the first interlayer insulating film 31. The second interlayer insulating film 41 includes a silicon nitride film 13 and a silicon oxide film 14. A capacitor 119 shown in FIG. 8 includes a lower electrode 116, a capacitor insulating film 117, and an upper electrode 118. The capacitor 19 penetrates through the second interlayer insulating film 41. As shown in FIG. 8, the lower electrode 116 is formed in a cup-shape that covers a bottom face and a side face of a cylinder 15. The lower electrode 116 is made of polysilicon, titanium nitride, or the like. The lower electrode 116 is electrically connected to the capacitor contact plug 112. As shown in FIG. 8, the lower electrode 116 covers the side face and top face of a top part 112a of the capacitor contact plug 112. The top part 112a of the capacitor contact plug 112 intrudes such as to fit into a bottom wall 116a of the lower electrode 116. A capacitor insulating film 17 is formed between the upper electrode 18 and the lower electrode 116.

In the semiconductor device of related art shown in FIG. 8, when forming the capacitor contact plug 112, a capacitor contact hole for forming the capacitor contact plug 112 is provided between adjacent bit-lines 51. To form the capacitor contact hole, it is conventional to use a self-aligned contact (SAC) etching technique in which etching is executed using an etching selection ratio of the bit-line interlayer insulating film 8 of silicon oxide to the bit-line insulating film 7 of silicon nitride.

However, as semiconductor devices become more miniaturized and thinner, it is becoming difficult to employ SAC etching in forming a capacitor contact hole. To maintain a short margin between the capacitor contact plug 112 and the bit-lines 51, the diameter of the capacitor contact plug 112 is shortened, and the capacitor contact plug 112 is formed by non-SAC.

As semiconductor devices become more miniaturized and thinner, to increase the area of the lower electrode 116 of the capacitor 119, if the height of the capacitor 19 is increased, the aspect ratio (height/hole diameter) of the cylinder 15 becomes larger. As a result, the size of the bottom diameter (diameter of the bottom face) of the cylinder 15 decreases with respect to that of the top diameter (diameter of the opening) of the cylinder 15. This reduces the area of the bottom face of the lower electrode 116 of the capacitor 119 that is electrically connected to the capacitor contact plug 112.

Since the diameter of the capacitor contact plug 112 and the area of the bottom face of the lower electrode 116 are decreasing in this way, the contact area between the capacitor contact plug 112 and the lower electrode 116 is being reduced.

Japanese Unexamined Patent Application, First Publication No. 2004-207681 discloses a semiconductor device in which an impurity dispersion layer of a cell transistor and a capacitor lower electrode are connected by a T-shaped contact plug.

Japanese Unexamined Patent Application, First Publication No. 2003-28734 discloses a semiconductor device in which roughness is imparted to a connection face between a source connection electrode and a source of a data transmission transistor.

Japanese Unexamined Patent Application, First Publication No. H 10-294441 discloses a semiconductor element including a connection plug having a protruding part, a top face and side faces of the protruding part contacting a first electrode of a capacitor.

Japanese Unexamined Patent Application, First Publication No. 2002-83881 discloses a semiconductor device including a DRAM in which polysilicon pads are provided between a cell contact and a bit contact, and between a cell contact and a cylinder-type accumulation capacitor lower electrode.

Japanese Unexamined Patent Application, First Publication No. 2005-167188 discloses a semiconductor device in which a top part area of a storage node contact plug is larger than a bottom part area, and the storage node contact plug is provided for electrically contacting a capacitor lower electrode and a plug.

However, even when using these conventional techniques, since the area of contact between the capacitor lower electrode and the capacitor contact plug is decreasing as semiconductor device become more miniaturized and thinner, the following problems arise. One problem is that the contact resistance increases, due to the reduced area of contact between the capacitor lower electrode and the capacitor contact plug. Another problem is that leak current increases, due to constriction of current at the connection section of the capacitor lower electrode and the capacitor contact plug.

The following problems also arise due to the reduced area of contact between the capacitor lower electrode and the capacitor contact plug. Due to plan-view positional deviation at the time of forming the lower electrode, there are cases where the lower electrode cannot be formed over the capacitor contact plug, in other words, cases where the lower electrode misses the capacitor contact plug.

SUMMARY OF THE INVENTION

The present invention takes the above circumstances into consideration. It is an object of the invention to provide a semiconductor device and manufacturing method thereof that can be miniaturized, while being capable of maintaining an adequate contact area between a contact plug and a conductive member on the contact plug, which is electrically connected to the contact plug, adequately lowering the contact resistance, and reducing constriction of current in a connection section, and in addition, when forming the conductive member, can prevent the contact plug from missing the conductive member.

The present inventor has completed the invention after careful consideration of solutions to the problems mentioned above. The invention relates to the following.

A semiconductor device of the present invention includes: a first interlayer insulating film; a first conductive member provided lower than the first interlayer insulating film; a contact plug that penetrates through the first interlayer insulating film, and is electrically connected to the first conductive member, the contact plug including a small-diameter part, and a large-diameter part arranged on the small-diameter part, an outer diameter of the large-diameter part being larger than an outer diameter of the small-diameter part, and the outer diameter of the large-diameter part being larger than an outer diameter of a connection face between the second conductive member and the large-diameter part; and a second conductive member that is provided on the first interlayer insulating film, and is electrically connected to the contact plug.

In the semiconductor device, the first interlayer insulating film may include a plug interlayer insulating film, and a bit-line interlayer insulating film provided on the plug interlayer insulating film, a plurality of bit-lines being formed between the plug interlayer insulating film and the bit-line interlayer insulating film, and the small-diameter part may be arranged between adjacent bit-lines, and an external shape of the large-diameter part may be larger than a distance between the adjacent bit-lines.

In the semiconductor device, the plurality of bit-lines may be covered with a bit-line insulating film, and at least part of the bit-line insulating film may overlap with the large-diameter part.

In the semiconductor device, a contact area enlargement hole that enlarges a contact area between the contact plug and the second conductive member, may be formed in a top face of the large-diameter part.

In the semiconductor device, the first conductive member may be electrically connected to an impurity dispersion layer of a transistor, and the second conductive member is a lower electrode of a capacitor that penetrates through a second interlayer insulating film provided on the first interlayer insulating film.

A manufacturing method of the semiconductor device may include: forming, on the first interlayer insulating film, a first resist mask exposing a small-diameter part formation region where the small-diameter part is formed; etching the first interlayer insulating film of the small-diameter part formation region to form a first capacitor contact hole having a bottom face exposed at a first conductive member; removing the first resist mask; forming, on the first interlayer insulating film, a second resist mask exposing a large-diameter part formation region where the large-diameter part on the first interlayer insulating film is formed; etching the first interlayer insulating film of the large-diameter part formation region to form a second capacitor contact hole; removing the second resist mask; forming the contact plug by filling the first capacitor contact hole and the second capacitor contact hole with a conductive material so as to form the small-diameter part and the large-diameter part; providing a second interlayer insulating film on the first interlayer insulating film and the large-diameter part, and etching the second interlayer insulating film provided on the large-diameter part, thereby forming a connection hole that penetrates through the second interlayer insulating film, and has a bottom face at least part of which the large-diameter part is exposed at, an outer diameter of the bottom face of the connection hole being smaller than the outer diameter of the large-diameter part; and forming a second conductive member that uses the large-diameter part exposed at the bottom face of the connection hole as a connection face to the contact plug.

In the semiconductor device manufacturing method, the first interlayer insulating film may include a plug interlayer insulating film, and a bit-line interlayer insulating film provided on the plug interlayer insulating film, and a plurality of bit-lines may be formed between the plug interlayer insulating film and the bit-line interlayer insulating film, the first capacitor contact hole may be formed between adjacent bit-lines, and an external shape of the second capacitor contact hole may be formed so as to be larger than a distance between the adjacent bit-lines.

In the semiconductor device manufacturing method, the bit-lines may be covered with a bit-line insulating film, and the second capacitor contact hole may be formed by using the bit-line insulating film as an etching stopper.

In the semiconductor device manufacturing method, a contact area enlargement hole may be formed in a top face of the large-diameter part to enlarge a contact area of the contact plug and the second conductive member, and the second conductive member may be formed along inner walls of the contact area enlargement hole.

In the semiconductor device manufacturing method, the connection hole may be a cylinder in which the inner diameter of a bottom face of the connection hole is smaller than an outer diameter of the large-diameter part, and forming the second conductive member, the second conductive member may be formed along an inner wall of the cylinder and may be used as a lower electrode of a capacitor.

In the semiconductor device manufacturing method, forming the second resist mask, the second resist mask may be formed in the first capacitor contact hole.

According to the invention, the contact plug includes a small-diameter part and a large-diameter part arranged on the small-diameter part, the outer diameter of the large-diameter part is larger than the outer diameter of the small-diameter part, and the outer diameter of the large-diameter part is larger than the outer diameter of a connection face between the second conductive member and the large-diameter part. This reduces the outer diameter of the small-diameter part and allows the semiconductor device to be miniaturized.

Moreover, according to the invention, the large-diameter part of the contact plug is larger than the outer diameter of the small-diameter part, and the outer diameter of the large-diameter part is larger than the outer diameter of a connection face between the second conductive member and the large-diameter part. This makes it possible to maintain an adequate contact area between the second conductive member and the contact plug. As a result, contact resistance between the second conductive member and the contact plug can be reduced; in addition, current is unlikely to constrict in the connection section between the second conductive member and the contact plug, whereby increase of leak current caused by current constriction can be reduced.

Further, according to the invention, the outer diameter of the large-diameter part of the contact plug is larger than the outer diameter of a connection face between the second conductive member and the large-diameter part. This can prevent the second conductive member from missing the contact plug when the second conductive member is being formed.

The semiconductor device manufacturing method of the embodiment of the invention includes: forming, on the first interlayer insulating film, a first resist mask exposing a small-diameter part formation region where the small-diameter part is formed; etching the first interlayer insulating film of the small-diameter part formation region to form a first capacitor contact hole having a bottom face exposed at a first conductive member; removing the first resist mask; forming, on the first interlayer insulating film, a second resist mask exposing a large-diameter part formation region where the large-diameter part will on the first interlayer insulating film is formed; etching the first interlayer insulating film of the large-diameter part formation region to form a second capacitor contact hole; removing the second resist mask; forming the contact plug by filling the first capacitor contact hole and the second capacitor contact hole with a conductive material so as to form the small-diameter part and the large-diameter part. This can obtain a contact plug including a small-diameter part and a large-diameter part arranged on the small-diameter part, the outer diameter of the large-diameter part is larger than the outer diameter of the small-diameter part, and the outer diameter of the large-diameter part is larger than the outer diameter of a connection face between the second conductive member and the large-diameter part. Since the outer diameter of the small-diameter part is thereby reduced, the semiconductor device can be miniaturized.

Moreover in the semiconductor device manufacturing method of the embodiment of the invention, after forming the contact plug, the method includes providing a second interlayer insulating film over the first interlayer insulating film and the large-diameter part, and etching the second interlayer insulating film provided on the large-diameter part, thereby forming a connection hole that penetrates through the second interlayer insulating film, and has a bottom face at least part of which the large-diameter part is exposed at, an outer diameter of the bottom face of the connection hole being smaller than an outer diameter of the large-diameter part, and forming a second conductive member that uses the large-diameter part exposed at a bottom face of the connection hole as a connection face to the contact plug. This can obtain a semiconductor device where an adequate contact area is maintained between the second conductive member and the contact plug.

According to the semiconductor device manufacturing method of the embodiment of the invention, since a contact area is adequately maintained between the second conductive member and the contact plug, a semiconductor device with low contact resistance between the second conductive member and the contact plug is obtained. Moreover, the second conductive member and the contact plug can be easily made to contact each other, and the second conductive member can be prevented from missing the contact plug when the second conductive member is being formed.

DETAILED DESCRIPTION OF THE INVENTION

A semiconductor device and a manufacturing method thereof according to a first embodiment of the invention will be explained using FIGS. 1 to 7.

Figure 1A:
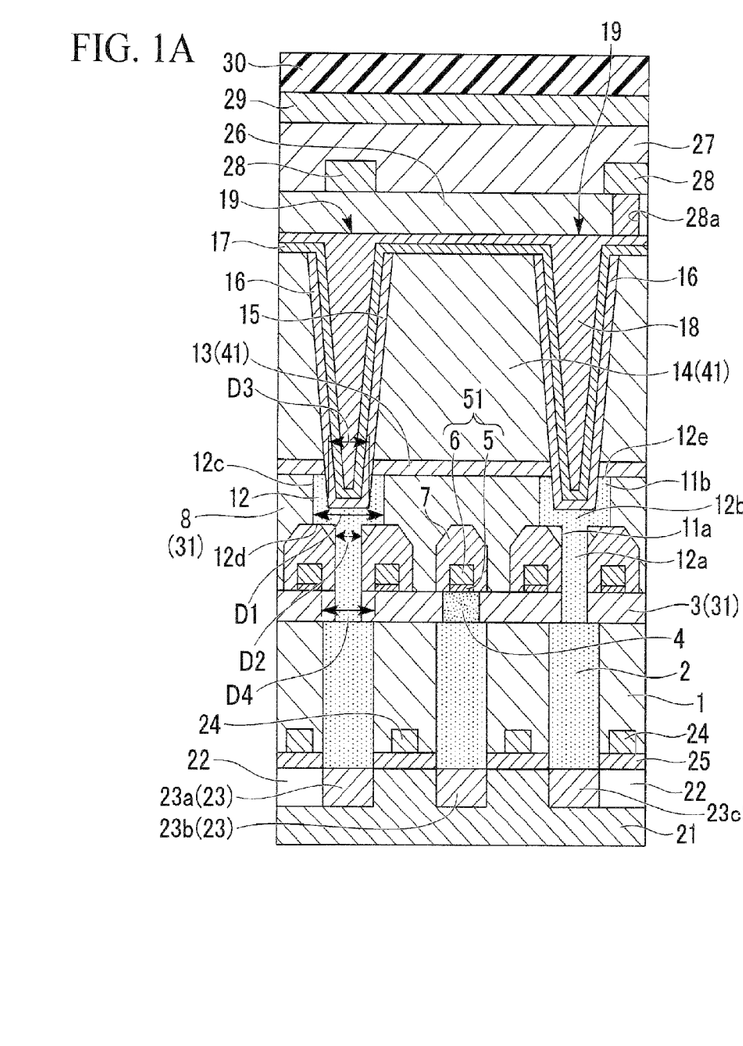
FIG. 1A is an explanatory view of a cross-sectional structure of a semiconductor device of the invention, and is a cross-sectional view in a direction parallel to a gate wiring.
Figure 1B:
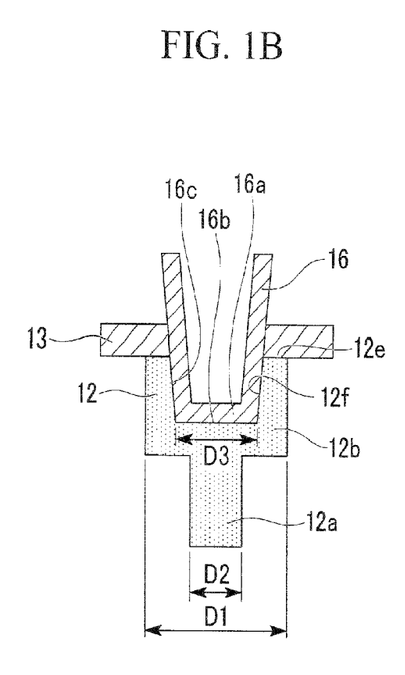
FIG. 1B is an enlarged view of one part of FIG. 1A.

FIG. 1A is an explanatory view of a cross-sectional structure of a semiconductor device of the invention, and is a cross-sectional view in a direction parallel to a gate wiring. FIG. 1B is an enlarged view of one part of FIG. 1A. In the semiconductor device shown in FIGS. 1A and 1B, parts which are common to those of the semiconductor device of related art shown in FIG. 8 are designated by the same reference numerals, and are not repetitiously explained.

In FIG. 1A, a substrate 21 is such as a silicon substrate. An element isolation region (STI) 22 shown in FIG. 1A is formed on the substrate 21. A switching transistor is provided on the substrate 21. The switching transistor includes a gate electrode 24, a gate oxidization film 25, and an impurity dispersion layer 23 including sources 23a and 23c, and a drain 23b. A gate interlayer insulating film 1 is formed on the gate electrode 24 such as to cover it. The gate interlayer insulating film 1 is made of silicon oxide film or the like. A cell contact plug 2 is provided on the impurity dispersion layer 23, in a contact hole that is formed by penetrating through the gate interlayer insulating film 1. The cell contact plug 2 is formed by filling the contact hole with a conductive material such as polysilicon.

In the semiconductor device shown in FIGS. 1A and 1B, the shape of the capacitor contact plug (contact plug) and the shape of the lower electrode (second conductive member) of the capacitor differ from those in the semiconductor device of related art shown in FIG. 8. The capacitor contact plug shown in FIG. 1A is formed by filling it with a conductive material such as polysilicon. A metal material such as titanium nitride and tungsten can be used as conductive material for making the capacitor contact plug 12. The capacitor contact plug 12 penetrates through the first interlayer insulating film 31. The capacitor contact plug 12 is electrically connected to the impurity dispersion layer 23 of the transistor via the cell contact plug (first conductive material) 2. The impurity dispersion layer 23 of the transistor is arranged in a layer below the gate interlayer insulating film 1, which is arranged in a layer below the first interlayer insulating film 31.

As shown in FIGS. 1A and 1B, the capacitor contact plug 12 includes a small-diameter part 12a and a large-diameter part 12b provided on the small-diameter part 12a. As shown in FIG. 1A, the small-diameter part 12a are arranged between adjacent bit-lines 51 such as to sandwich a bit-line insulating film 7. A side face 12c of the large-diameter part 12b is embedded in the bit-line interlayer insulating film 8 constituting the first interlayer insulating film 31. An edge of an extending part 12d is formed in the large-diameter part 12b, such as to extend outwardly from a top end of the small-diameter part 12a. The edge of this extending part 12d contacts a top face of the bit-line insulating film 7. One part of the bit-line insulating film 7 overlaps with the large-diameter part 12b. A top face 12e of the large-diameter part 12b is exposed on the bit-line interlayer insulating film 8. As shown in FIG. 1B, a contact area enlargement hole 12f is formed in the top face 12e of the large-diameter part 12b. The contact area enlargement hole 12f enlarges the contact area between the capacitor contact plug 12 and the lower electrode 16. As shown in FIG. 1A, the contact area enlargement hole 12f constitutes parts of a bottom face and a side face of a cylinder 15.

As shown in FIG. 1A, the outer diameter D1 of the large-diameter part 12b is larger than the outer diameter D2 of the small-diameter part 12a. The outer diameter D1 is also larger than a distance D4 between adjacent bit-lines 51. As shown in FIGS. 1A and 1B, the outer diameter D1 of the large-diameter part 12b is larger than the outer diameter D3 of a bottom face of the lower electrode 16. The outer diameter of the large-diameter part 12b is larger than a contact face 16b of the lower electrode 16 and the large-diameter part 12b. The outer diameter D1 of each large-diameter part 12b is sized such that adjacent large-diameter parts 12b do not contact each other. Considering problems of misalignment, the outer diameter D3 of the bottom face of the lower electrode 16 is preferably small enough to be accommodated reliably and completely inside the outer diameter D1 of the large-diameter part 12b.

Considering problems such as misalignment, the outer diameter D2 of the small-diameter part 12a is preferably not less than 40 nm shorter than the distance D3 between adjacent bit-lines 51.

A capacitor 19 shown in FIG. 1A includes the lower electrode 16, a capacitor insulating film 17, and an upper electrode 18. The capacitor 19 penetrates through a second interlayer insulating film 41. The lower electrode 16 is formed in a cup-shape, covering the bottom and side faces of the cylinder 15. As shown in FIG. 1B, a bottom wall 16a of the lower electrode 16 is flat. The bottom wall 16a and parts of sides walls 16c of the lower electrode 16 are formed along inner walls of the contact area enlargement hole 12f of the capacitor contact plug 12 that constitutes the cylinder 15. The lower electrode 16 is made of such as polysilicon, or titanium nitride film. The lower electrode 16 is electrically connected to the capacitor contact plug 12. The upper electrode 18 is formed over the lower electrode 16 and the second interlayer insulating film 41, with the capacitor insulating film 17 therebetween. The capacitor insulating film 17 is made of such as aluminum oxide film. The upper electrode 18 is made of such as titanium nitride film.

As shown in FIG. 1A, an upper wiring interlayer insulating film 26 is formed on the upper electrode 18 of the capacitor 19. A first upper wiring 28 made of such as aluminum oxide is formed on the upper wiring interlayer insulating film 26. As shown in FIG. 1A, the first upper wiring 28 is electrically connected to the upper electrode 18 of the capacitor 19 via a through-hole 28a penetrating through the upper wiring interlayer insulating film 26. An upper wiring insulating film 27 is formed on the first upper wiring 28 such as to cover it. A second upper wiring 29 made of such as aluminum film is formed on the upper wiring insulating film 27. The second upper wiring 29 is covered by a protective film 30 made of such as polyimide.

Subsequently, a method of manufacturing the semiconductor device shown in FIG. 1A will be explained with reference to FIGS. 2 to 7.

To manufacture the semiconductor device shown in FIG. 1A, an element isolation region (STI) 22 is formed on a substrate 21 such as a silicon substrate, and partitioned with isolation insulating film, using conventional techniques. A switching transistor is then formed on the substrate 21 using conventional techniques such as lithography, etching, ion-injection, and film-growth. The switching transistor includes a gate electrode 24, a gate oxidization film 25, and an impurity dispersion layer 23 having sources 23a and 23c, and a drain 23b.

Figure 2A:
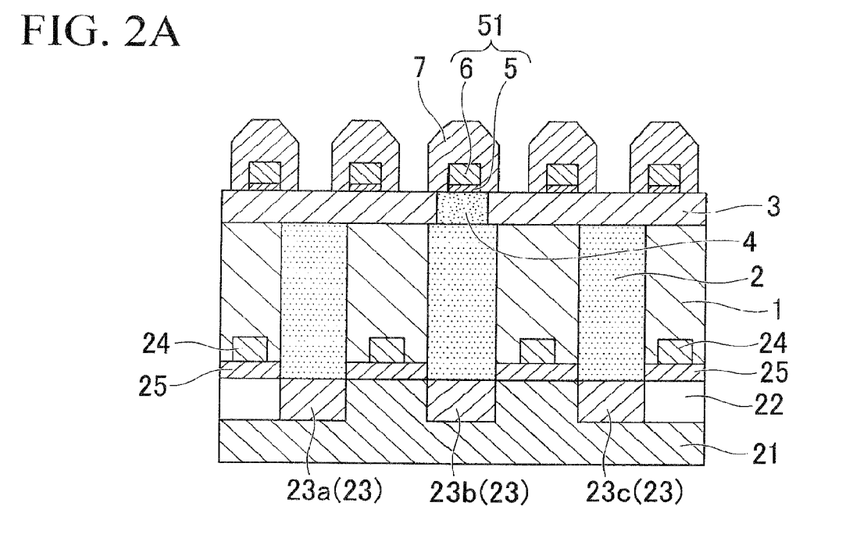
FIG. 2A is a cross-sectional explanatory view of a method of manufacturing the semiconductor device shown in FIG. 1A.

Subsequently, the gate interlayer insulating film 1 made of such as silicon oxide film shown in FIG. 2A is formed on the transistor. Thereafter, a conventional technique such as lithography and etching is used to make a contact hole that penetrates through the gate interlayer insulating film 1 and exposes the impurity dispersion layer 23 of the transistor. This contact hole is filled with a conductive material such as polysilicon to form a cell contact plug 2 that is electrically connected to the impurity dispersion layer 23.

Next, a plug interlayer insulating film 3 is formed over the gate interlayer insulating film 1 and the cell contact plug 2. The plug interlayer insulating film 3 on the cell contact plug 2 is opened to make an opening. This opening is filled with a conductive material such as metal to form a bit contact plug 4 that is electrically connected to the cell contact plug 2.

A plurality of bit-lines 51 are formed in a region where the bit contact plug 4 is exposed on the plug interlayer insulating film 3. In other words, the plurality of bit-lines 51 are formed on the exposed bit contact plug 4 formed in the plug interlayer insulating film 3. The plurality of bit-lines 51 include a tungsten nitride film 5 and a metal film 6 such as tungsten film. A bit-line insulating film 7 of silicon nitride is then formed such as to cover the bit-lines 51 (FIG. 2A).

Figure 2B:
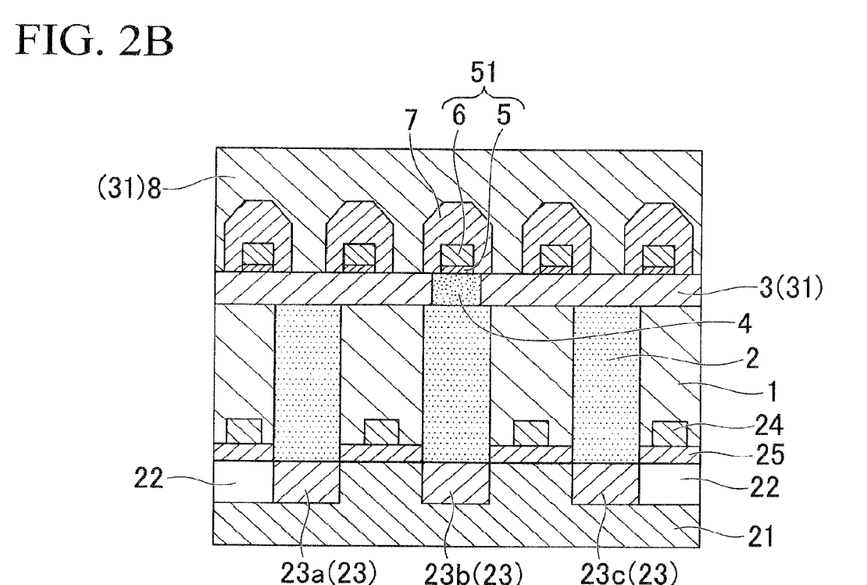
FIG. 2B is a cross-sectional explanatory view of a method of manufacturing the semiconductor device shown in FIG. 1A.

Next, a bit-line interlayer insulating film 8 of silicon oxide is formed such as to cover the plug interlayer insulating film 3 and the bit-line insulating film 7. This forms a first interlayer insulating film 31 including the plug interlayer insulating film 3 and the bit-line interlayer insulating film 8 (FIG. 2B).

Figure 3:
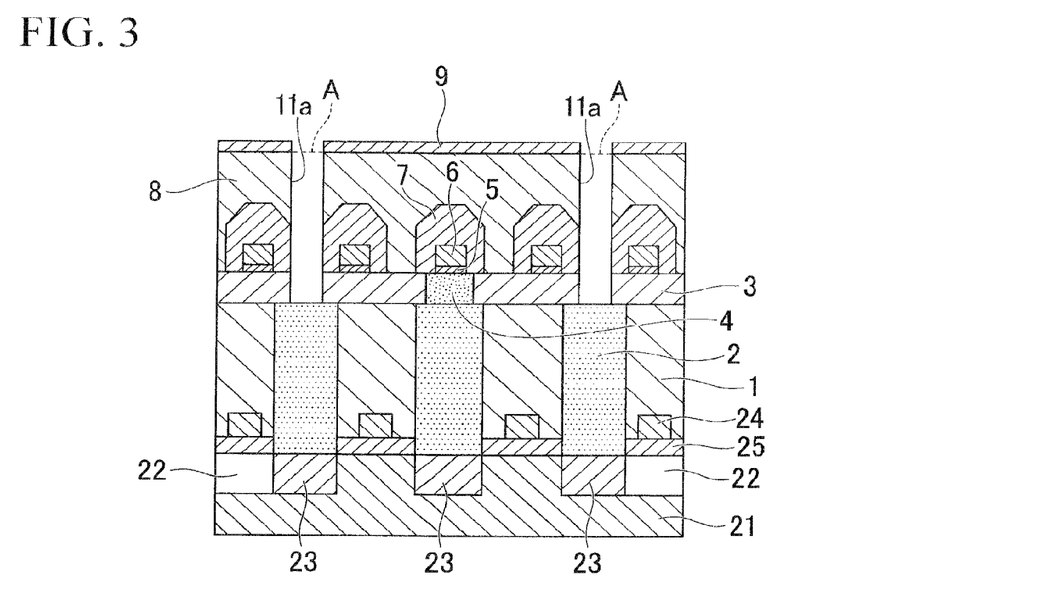
FIG. 3 is a cross-sectional explanatory view of a method of manufacturing the semiconductor device shown in FIG. 1A.

A photoresist is then applied on the bit-line interlayer insulating film 8, and, as shown in FIG. 3, a photography technique is used to form a first resist mask 9 that exposes a small-diameter part formation region A of the bit-line interlayer insulating film 8. The small-diameter part formation region A includes a region that overlaps the cell contact plug 2, and is located between adjacent bit-lines 51 in plan view. The small-diameter part formation region A is where the small-diameter part 12a of the capacitor contact plug 12 will be formed.

The plug interlayer insulating film 3 and the bit-line interlayer insulating film 8 of the small-diameter part formation region A are subjected to dry etching, forming a first capacitor contact hole 11a. This first capacitor contact hole 11a is formed between bit-lines 51 adjacent to the first capacitor contact hole 11a, and its bottom face is exposed in the cell contact plug 2 (first etching step) (FIG. 3). The first resist mask 9 is then removed.

Figure 4:
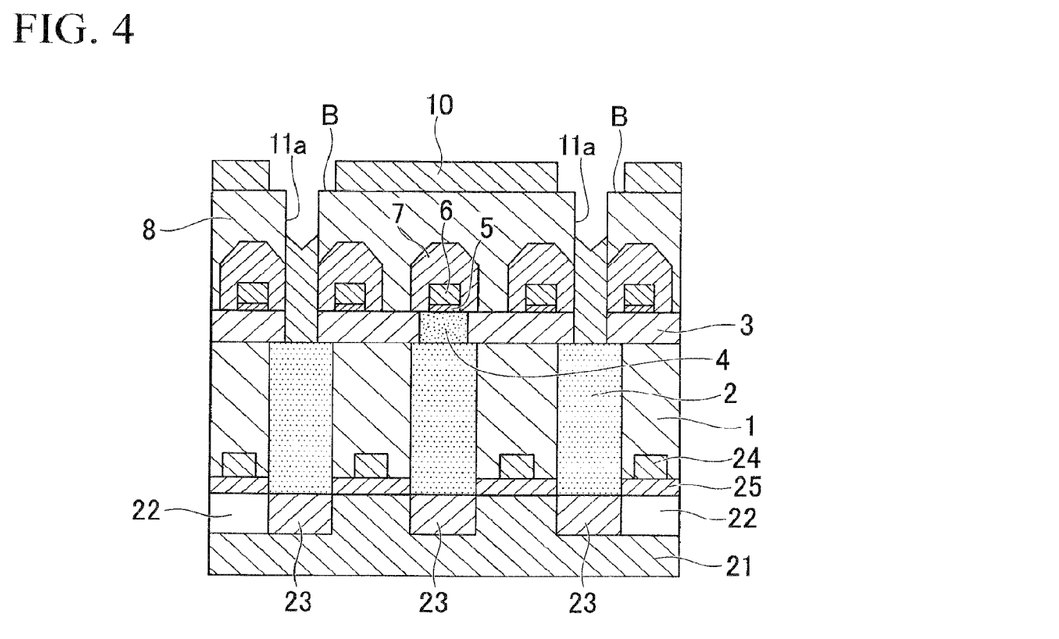
FIG. 4 is a cross-sectional explanatory view of a method of manufacturing the semiconductor device shown in FIG. 1A.

Another photoresist is applied on the bit-line interlayer insulating film 8, and, as shown in FIG. 4, a photography technique is used to form a second resist mask 10 that exposes a large-diameter part formation region B on the bit-line interlayer insulating film 8. The large-diameter part formation region B is where the large-diameter part 12b of the capacitor contact plug 12 will be formed.

In this embodiment, the large-diameter part formation region B on the bit-line interlayer insulating film 8 does not overlap in plan view with the small-diameter part 12a of the region where the large-diameter part 12b of the capacitor contact plug 12 will be formed, and spans adjacent bit-lines 51 in plan view. In other words, the large-diameter part formation region B on the bit-line interlayer insulating film 8 surrounds, but does not contain, the small-diameter part formation region A, thus making it a peripheral region of the small-diameter part formation region A. The photoresist for the second resist mask 10 is filled into the first capacitor contact hole 11a by applying photoresist to the bit-line interlayer insulating film 8. This photoresist is not removed when forming the second resist mask 10 that exposes the large-diameter part formation region B on the bit-line interlayer insulating film 8, and remains in the first capacitor contact hole 11a. As shown in FIG. 4, this photoresist forms one part of the second resist mask 10. As described above, since the second resist mask 10 is also formed in the first capacitor contact hole 11a, the first capacitor contact hole 11a can be prevented from being destroyed when performing dry etching for forming a second capacitor contact hole 11b shown in FIG. 5.

Figure 5:
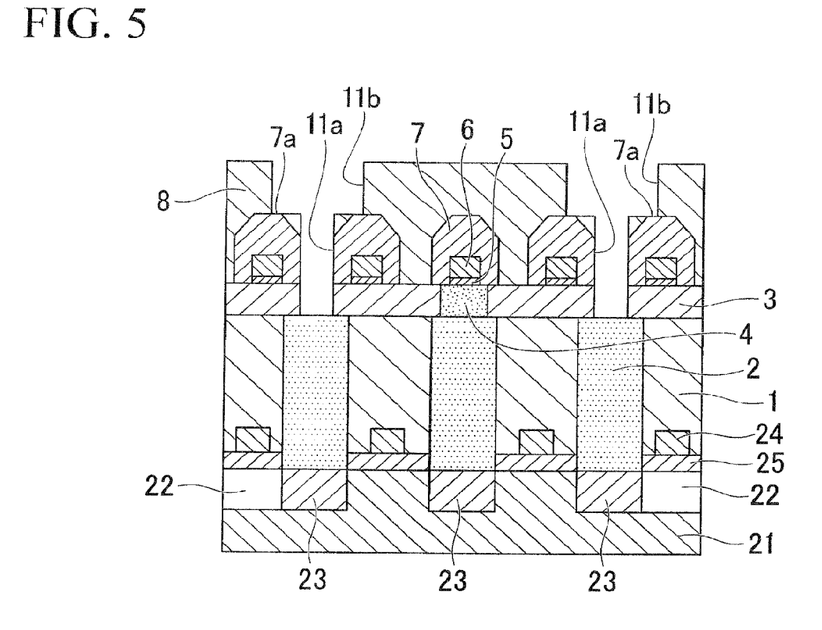
FIG. 5 is a cross-sectional explanatory view of a method of manufacturing the semiconductor device shown in FIG. 1A.

Then, the bit-line interlayer insulating film 8 of the large-diameter part formation region B is subjected to dry etching to form the second capacitor contact hole 11b (second etching step). In this embodiment, in a second etching step of etching the bit-line interlayer insulating film 8 is executed using an etching selection ratio of the bit-line interlayer insulating film 8 of silicon oxide to the bit-line insulating film 7 of silicon nitride, and a top face 7a of the bit-line insulating film 7 is used as an etching stopper. In the second etching step, the outer shape of second capacitor contact hole 11b is formed so as to be larger than the distance between adjacent bit-lines 51. The second resist mask 10 is then removed (FIG. 5).

Figure 6:
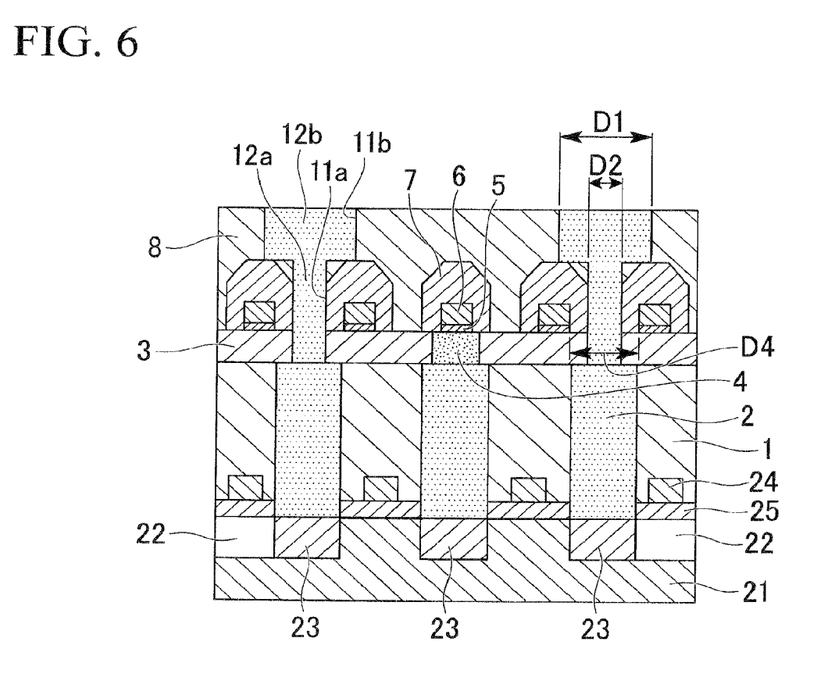
FIG. 6 is a cross-sectional explanatory view of a method of manufacturing the semiconductor device shown in FIG. 1A.

A polysilicon film is grown over the bit-line interlayer insulating film 8 where the first capacitor contact hole 11a and the second capacitor contact hole 11b are formed, filling the first capacitor contact hole 11a and the second capacitor contact hole 11b with polysilicon. The polysilicon is etched back by dry etching, thereby forming a capacitor contact plug 12 which is electrically connected to the cell contact plug 2 and includes the small-diameter part 12a and the large-diameter part 12b (FIG. 6). As shown in FIG. 6, the outer diameter D1 of the large-diameter part 12b of the capacitor contact plug 12 thus obtained is larger than the outer diameter D2 of the small-diameter part 12a, and also larger than the distance D4 between adjacent bit-lines 51.

Figure 7A:
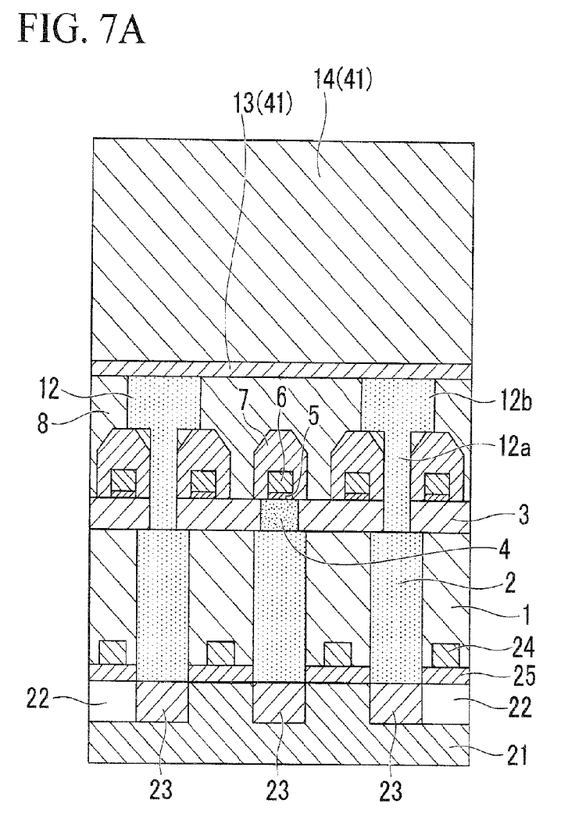
FIG. 7A is a cross-sectional explanatory view of a method of manufacturing the semiconductor device shown in FIG. 1A.
Figure 7B:
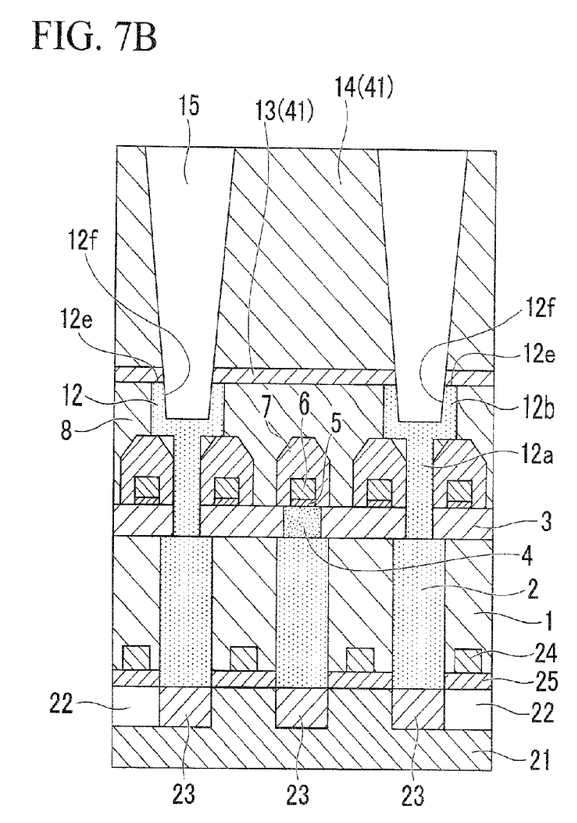
FIG. 7B is a cross-sectional explanatory view of a method of manufacturing the semiconductor device shown in FIG. 1A.

Thereafter, a second interlayer insulating film 41 including a silicon nitride film 13 and a silicon oxide film 14 is provided on the bit-line interlayer insulating film 8 and the large-diameter part 12b (FIG. 7A). As shown in FIG. 7B, the second interlayer insulating film 41 provided on the large-diameter part 12b is opened using photolithography and dry etching, forming a cup-shaped cylinder (connection hole) 15 (third etching step). The cylinder 15 thus formed penetrates through the second interlayer insulating film 41, and the large-diameter part 12b is exposed across the entire bottom face of the cylinder 15. The area of the inner diameter of the bottom face of the cylinder 15 (in other words, the outer diameter D3 of the bottom face of the lower electrode 16 shown in FIG. 1B) is smaller than the area of the outer diameter D1 of the large-diameter part 12b. Moreover, the outer diameter of the bottom face of the cylinder 15 is smaller than the outer diameter of the large-diameter part 12b. In this embodiment, in a third etching step, a contact area enlargement hole 12f is provided in the top face 12e of the large-diameter part 12b, and enlarges the contact area of the capacitor contact plug 12 and a lower electrode 16.

A lower electrode 16 is then formed by applying a film of conductive material such as polysilicon to the inner walls of the cylinder 15 (second conductive member formation step). This lower electrode 16 is electrically connected to the capacitor contact plug 12 by using the large-diameter part 12b exposed at the bottom face of the cylinder 15 (in other words, the inner wall of the contact area enlargement hole 120 as a connection face 16c to the capacitor contact plug 12. As shown in FIG. 1B, the connection face 16b between the lower electrode 16 and the capacitor contact plug 12 has a smaller outer diameter than the outer diameter of the large-diameter part 12b.

The capacitor 19 is formed in the following manner. A capacitor insulating film 17 made of such as aluminum oxide is formed on the lower electrode 16 and the second interlayer insulating film 41. Titanium nitride film or the like is filled over the capacitor insulating film 17 in the cylinder 15, forming an upper electrode 18. By these steps, the capacitor 19 is formed.

An upper wiring interlayer insulating film 26 is then formed on the upper electrode 18 of the capacitor 19. A through-hole 28a is formed such as to penetrate though the upper wiring interlayer insulating film 26 and electrically connect to the upper electrode 18 of the capacitor 19. An aluminum film is then formed on the upper wiring interlayer insulating film 26 and the through-hole 28a, and patterned to form a first upper wiring 28. Thereafter, conventional techniques are employed to cover the first upper wiring 28 with an upper wiring insulating film 27, form a second upper wiring 29 made of such as aluminum on the upper wiring insulating film 27, and form a protective film 30 of such as polyimide on the second upper wiring 29. The semiconductor device shown in FIG. 1A is thus obtained.

According to the semiconductor device of this embodiment, the capacitor contact plug 12 includes the small-diameter part 12a and the large-diameter part 12b. Therefore, the outer diameter D2 of the small-diameter part 12a can be made smaller and the semiconductor device can be made more detailed.

Further, according to the semiconductor device of this embodiment, the outer diameter D1 of the large-diameter part 12b is larger than the outer diameter D2 of the small-diameter part 12a, and the outer diameter of the large-diameter part 12b is larger than the outer diameter of the connection face 16b of the lower electrode 16 and the capacitor contact plug 12. This enables the contact area of the lower electrode 16 and the capacitor contact plug 12 to be adequately maintained. As a result, contact resistance between the lower electrode 16 and the capacitor contact plug 12 can be reduced, and in addition, current is unlikely to constrict in the connection section of the lower electrode 16 and the capacitor contact plug 12, whereby an increase of leak current due to current constriction can be reduced.

According to the semiconductor device of this embodiment, the outer diameter of the large-diameter part 12b of the capacitor contact plug 12 is larger than the outer diameter of the connection face 16b of the lower electrode 16 and the capacitor contact plug 12. This makes it easier to form the lower electrode 16, which includes the flat bottom wall 16a. Therefore, current is even less likely to constrict in the connection section of the lower electrode 16 and the capacitor contact plug 12.

Figure 9:
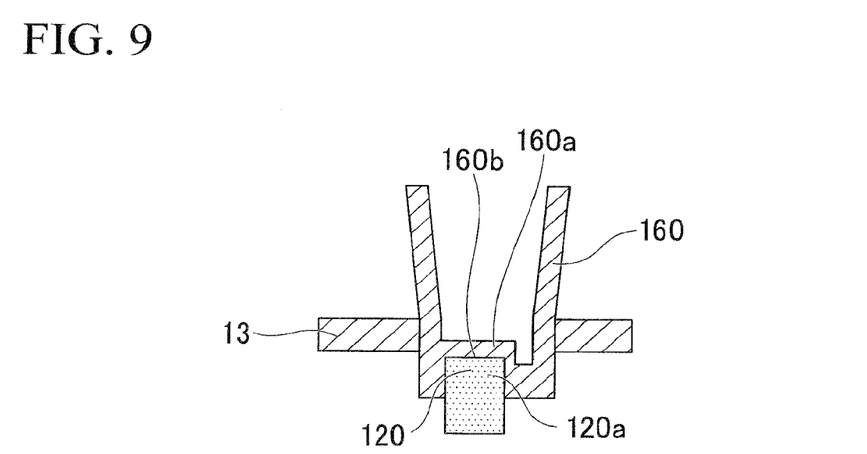
FIG. 9 is an explanatory diagram of effects of the semiconductor device of the invention, and is a cross-sectional view of one example of a semiconductor device according to a comparative example of the invention.

When, for example, instead of the capacitor contact plug 12 shown in FIGS. 1A and 1B, the configuration uses a capacitor contact plug 120 that is I-shaped in cross-sectional view, having an approximately fixed outer diameter in the depth direction and capable of being provided between adjacent bit-lines, as in a semiconductor device shown in FIG. 9, the area of a connection face 160b of a lower electrode 160 and the capacitor contact plug 120 is the same as the area of the capacitor contact plug 120. As a consequence, side faces and a top face of a top part 120a of the capacitor contact plug 120 intrude into a bottom wall 160a of the lower electrode 160, tending to form a step in the bottom wall 160a of the lower electrode 160. As a result, current is likely to constrict in the connection section of the lower electrode 160 and the capacitor contact plug 120.

According to the semiconductor device of the present invention, the outer diameter of the large-diameter part 12b of the capacitor contact plug 12 is larger than the outer diameter of the connection face 16b of the lower electrode 16 and the capacitor contact plug 12. This can prevent the lower electrode 16 from missing the capacitor contact plug 12 during formation of the lower electrode 16.

In the semiconductor device of this embodiment, the first interlayer insulating film 31 includes the plug interlayer insulating film 3 and the bit-line interlayer insulating film 8 provided on the plug interlayer insulating film 3. A plurality of bit-lines 51 are formed between the plug interlayer insulating film 3 and the bit-line interlayer insulating film 8. The small-diameter part 12a of the capacitor contact plug 12 is arranged between adjacent bit-lines 51. The large-diameter part 12b has an external shape D1 that is larger than the distance between adjacent bit-lines 51. Therefore, the outer diameter of the large-diameter part 12b capable of contacting the lower electrode 16 can be further increased.

In the semiconductor device of this embodiment, the bit-line 51 is covered by the bit-line insulating film 7, and at least one part of the bit-line insulating film 7 overlaps with the large-diameter part 12b of the capacitor contact plug 12. Therefore, the bit-line insulating film 7 can be used as an etching stopper in etching the bit-line interlayer insulating film 8 of the large-diameter part formation region B, forming the second capacitor contact hole 11b. This makes it possible to easily and precisely form the capacitor contact plug 12 in which the outer diameter D1 of the large-diameter part 12b is larger than the outer diameter D2 of the small-diameter part 12a.

Further, in the semiconductor device of this embodiment, the contact area enlargement hole 12f for enlarging the contact area of the capacitor contact plug 12 and the lower electrode 16 is provided in the top face 12e of the large-diameter part 12b of the capacitor contact plug 12. This can increase the contact area of the lower electrode 16 and the capacitor contact plug 12. As a result, contact resistance between the lower electrode 16 and the capacitor contact plug 12 can be further reduced.

According to a semiconductor device manufacturing method of this embodiment, the semiconductor device of this embodiment can be obtained in which the capacitor contact plug 12 includes the small-diameter part 12a and the large-diameter part 12b, the outer diameter D1 of the large-diameter part 12b is larger than the outer diameter D2 of the small-diameter part 12a, and the outer diameter of the large-diameter part 12b is larger than the outer diameter of a connection face 16b between a lower electrode 16 and the capacitor contact plug 12.

Further, in the semiconductor device manufacturing method of this embodiment, the capacitor contact plug 12 is formed which can maintain an adequate contact area with the lower electrode 16. Therefore, the lower electrode 16 and the capacitor contact plug 12 can be easily made to contact each other by performing a third etching step and a second conductive material formation step, and, when forming the lower electrode 16, the lower electrode 16 can be prevented from missing from the capacitor contact plug 12.

Further, in the semiconductor device manufacturing method of this embodiment, the first interlayer insulating film 31 includes the plug interlayer insulating film 3 and the bit-line interlayer insulating film 8 provided on the plug interlayer insulating film 3. A plurality of bit-lines 51 are provided between the plug interlayer insulating film 3 and the bit-line interlayer insulating film 8. In a first etching step, the first capacitor contact hole 11a is formed between adjacent bit-lines 51. In a second etching step, the second capacitor contact hole 11b is formed such that its external shape is larger than the distance between adjacent bit-lines 51. The small-diameter part 12a of the capacitor contact plug 12 is thereby arranged between adjacent bit-lines 51. It is also possible to form a capacitor contact plug 12 having a large-diameter part 12b whose external shape D1 is larger than the distance between adjacent bit-lines 51.

Further, in the semiconductor device manufacturing method of this embodiment, in a step of forming the second resist mask 10, the second resist mask 10 is formed in a first capacitor contact hole 11a. This can prevent the first capacitor contact hole 11a from being destroyed when performing dry etching for forming a second capacitor contact hole 11b.

It is apparent that the present invention is not limited to the above embodiments, but may be modified and changed without departing from the scope and spirit of the invention.

For example, as described above, the embodiments of the invention can be used effectively when the first conductive member is a cell contact plug that is electrically connected to the impurity dispersion layer of a transistor, the second conductive member is a lower electrode of a DRAM capacitor, and the contact plug is a capacitor contact plug for electrically connecting the cell contact plug to the lower electrode. However, this example is not limitative of the first conductive member, the second conductive member, and the contact plug that constitute the embodiments of the invention.

What is claimed is:

1. A semiconductor device comprising:
a first interlayer insulating film, the first interlayer insulating film including a plug interlayer insulating film, and a bit-line interlayer insulating film provided on said plug interlayer insulating film, a plurality of bit-lines being formed between said plug interlayer insulating film and said bit-line interlayer insulating film, the plurality of bit-lines being covered with a bit-line insulating film disposed between the bit-line interlayer insulating film and the plug interlayer insulating film;
a second interlayer insulating film provided above the first interlayer insulating film;
a first conductive member provided lower than said first interlayer insulating film;
a contact plug comprising a single piece of conductor that includes a small-diameter part, and a large-diameter part arranged over said small-diameter part, an outer diameter of said large-diameter part being larger than an outer diameter of said small-diameter part, said contact plug penetrating through said first interlayer insulating film, and being electrically connected to said first conductive member, said large-diameter part of said contact plug having a top surface with a dented portion toward a bottom of said contact plug, the contact plug being arranged between adjacent bit-lines, at least part of the contact plug being located over a top surface of the bit-line insulating film over the bit-lines; and
a second conductive member that is provided on said first interlayer insulating film, and is electrically connected to said contact plug within said dented portion of said large-diameter part of said contact plug, the second conductive member having an outer diameter of a topmost edge of said second conductive member larger than an outer diameter of a bottom of said second conductive member, the second conductive member having side walls and the bottom extending therebetween, the side walls continuously narrowing and extending through the second interlayer insulating film to the first interlayer insulating film within the dented portion of the large-diameter part of the contact plug,
wherein the outer diameter of said large-diameter part is larger than the outer diameter of the bottom of said second conductive member, and
the outer diameter of the bottom of the second conductive member is larger than a diameter of the contact plug between adjacent bit-lines.

2. The semiconductor device according to claim 1, wherein the outer diameter of said second conductive member increases from the bottom toward the topmost edge of said second conductive member.

3. The semiconductor device according to claim 2, wherein a portion of said contact plug surrounds the bottom of said second conductive member.

4. The semiconductor device according to claim 2, wherein said second conductive member comprises a different material from said contact plug.

5. The semiconductor device according to claim 2, further comprising:
a third conductive member provided over said second conductive member; and
an insulating layer sandwiched between said second conductive member and said third conductive member.

6. A semiconductor device comprising:
a first interlayer insulating film, the first interlayer insulating film including a plug interlayer insulating film, and a bit-line interlayer insulating film provided on the plug interlayer insulating film, a plurality of bit-lines being formed between the plug interlayer insulating film and the bit-line interlayer insulating film, the plurality of bit-lines being covered with a bit-line insulating film disposed between the bit-line interlayer insulating film and the plug interlayer insulating film;
a second interlayer insulating film provided above the first interlayer insulating film;
a first conductive member provided lower than said first interlayer insulating film;
a contact plug formed inside a hole that penetrates through said first interlayer insulating film, and being electrically connected to said first conductive member, said contact plug comprising a single piece of conductor that includes a small-diameter part, and a large-diameter part arranged over said small-diameter part, an outer diameter of said large-diameter part being larger than an outer diameter of said small-diameter part, said large-diameter part of said contact plug having a top surface with a dented portion toward a bottom of said contact plug, the contact plug being arranged between adjacent bit-lines, at least part of the contact plug being located over a top surface of the bit-line insulating film over the bit-lines; and
a second conductive member that is provided on said first interlayer insulating film, and is electrically connected to said contact plug within said dented portion of said large-diameter part of said contact plug, the second conductive member having side walls and a bottom extending therebetween,
wherein an outer diameter of a topmost edge of said second conductive member is larger than an outer diameter of a bottom of said second conductive member, the outer diameter of said second conductive member continuously increasing from the bottom toward the topmost edge of said second conductive member, the side walls continuously narrowing and extending through the second interlayer insulating film to the first interlayer insulating film within the dented portion of the large-diameter part of the contact plug, and
the outer diameter of the bottom of the second conductive member is larger than a diameter of the contact plug between adjacent bit-lines.

7. The semiconductor device according to claim 6, further comprising:
a third conductive member provided over said second conductive member; and
a second insulating layer sandwiched between said second conductive member and said third conductive member.

8. The semiconductor device according to claim 6, wherein the outer diameter of said large-diameter part is smaller than the outer diameter of the topmost edge of said second conductive member.

9. A semiconductor device comprising:
a first interlayer insulating film comprising a plurality of insulating films including a first insulating film;
a second interlayer insulating film provided above the first interlayer insulating film;
a first conductive member provided lower than said first interlayer insulating film;
a contact plug formed inside a hole that penetrates through said first interlayer insulating film, and being electrically connected to said first conductive member, said contact plug comprising a single piece of conductor that includes a small-diameter part, and a large-diameter part arranged over said small-diameter part, an outer diameter of said large-diameter part being larger than an outer diameter of said small-diameter part, a plurality of bit-lines being provided between the contact plug and the first conductive member, the plurality of bit-lines being covered with a bit-line insulating film, at least part of the contact plug being located over a top surface of the bit-line insulating film over the bit-lines; and
a second conductive member that is provided on said first interlayer insulating film, and is electrically connected to said contact plug, the second conductive member having side walls and a bottom extending therebetween, a contact face between the bottom of said second conductive member and a top surface of said large-diameter part of said contact plug being lower in position than a top surface of said first insulating film, and upper in position than a bottom surface of said first insulating film, the side walls continuously narrowing and extending through the second interlayer insulating film to the first interlayer insulating film,
wherein an outer diameter of a topmost edge of said second conductive member is larger than an outer diameter of a bottom of said second conductive member, the outer diameter of said second conductive member continuously increasing from the bottom toward the topmost edge of the second conductive member, and
the outer diameter of the bottom of the second conductive member is larger than a diameter of the contact plug between adjacent bit-lines.

10. The semiconductor device according to claim 9, further comprising:
a third conductive member provided over said second conductive member; and
a second insulating layer sandwiched between said second conductive member and said third conductive member.

11. The semiconductor device according to claim 9, wherein:
said first interlayer insulating film includes a plug interlayer insulating film, and the bit-line insulating film provided on said plug interlayer insulating film, the plurality of bit-lines being formed between said plug interlayer insulating film and said bit-line insulating film, and said contact plug is arranged between adjacent bit-lines.

12. The semiconductor device according to claim 9, wherein the outer diameter of said large-diameter part is smaller than an outer diameter of the topmost edge of said second conductive member.

13. The semiconductor device according to claim 9, wherein said second conductive member comprises a different material from said contact plug.

* * * * *